US008999068B2

(12) United States Patent
Honda et al.

(10) Patent No.: US 8,999,068 B2
(45) Date of Patent: Apr. 7, 2015

(54) CHAMBER CLEANING METHOD (75) Inventors: Masanobu Honda, Yamanashi (JP);
Hidetoshi Hanaoka, Yamanashi (JP);
Taichi Hirano, Yamanashi (JP);
Takanori Mimura, Yamanashi (JP);
Manabu Iwata, Yamanashi (JP);
Taketoshi Okajo, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 484 days.

(21) Appl. No.: 12/873,458

(22) Filed: Sep. 1, 2010

(65) Prior Publication Data

US 2011/0048453 A1 Mar. 3, 2011

Related U.S. Application Data (60) Provisional application No. 61/252,200, filed on Oct. 16, 2009.

(30) Foreign Application Priority Data

Sep. 3, 2009 (JP) .................................. 2009-203584

(51) Int. Cl.
*C23C 16/44* (2006.01)
*H01J 37/32* (2006.01)
(52) U.S. Cl.
CPC ....... *C23C 16/4405* (2013.01); *H01J 37/32862* (2013.01)
(58) Field of Classification Search
CPC ........................ H01J 37/32862; C23C 16/4405
USPC ...................... 134/1.1, 1.2, 1.3; 216/67; 438/9
See application file for complete search history.

(56) References Cited

U.S. PATENT DOCUMENTS

| 5,507,874 | A | * | 4/1996 | Su et al. ............................ 134/1 |
| 5,822,171 | A | * | 10/1998 | Shamouilian et al. ........ 361/234 |
| 6,090,718 | A | * | 7/2000 | Soga et al. .................... 438/714 |
| 7,028,696 | B2 | * | 4/2006 | Richardson et al. ........... 134/1.1 |
| 2003/0029475 | A1 | * | 2/2003 | Hua et al. ...................... 134/1.1 |
| 2003/0183244 | A1 | * | 10/2003 | Rossman ....................... 134/1.1 |
| 2003/0200984 | A1 | * | 10/2003 | Streck et al. ................... 134/1.1 |
| 2004/0013818 | A1 | * | 1/2004 | Moon et al. ................... 427/576 |
| 2004/0200499 | A1 | * | 10/2004 | Harvey et al. .................. 134/1.1 |
| 2005/0127192 | A1 | * | 6/2005 | Kang et al. .................... 236/1 C |
| 2006/0091104 | A1 | * | 5/2006 | Takeshita et al. ............... 216/37 |
| 2009/0188627 | A1 | * | 7/2009 | Fang et al. ............... 156/345.43 |

FOREIGN PATENT DOCUMENTS

| JP | 11-087324 A | 3/1999 |
| JP | 2001-267406 A | 9/2001 |
| JP | 2003-151971 A | 5/2003 |
| JP | 2006-005128 A | 1/2006 |
| WO | 2007/149694 A2 | 12/2007 |
| WO | 2009/097089 A2 | 8/2009 |

* cited by examiner

*Primary Examiner* — Michael Kornakov
*Assistant Examiner* — Katelyn Whatley
(74) *Attorney, Agent, or Firm* — Pearne & Gordon LLP (57) ABSTRACT Provided is a chamber cleaning method capable of efficiently removing a CF-based shoulder deposit containing Si and Al deposited on an outer periphery of an ESC. A mixed gas of an $O_2$ gas and a F containing gas is supplied toward an outer periphery 24a of an ESC 24 at a pressure ranging from about 400 mTorr to about 800 mTorr; plasma generated from the mixed gas is irradiated onto the outer periphery 24a of the ESC 24; an $O_2$ single gas as a mask gas is supplied to the top surface of ESC 24 except the outer periphery 24a; and the shoulder deposit 50 adhered to the outer periphery 24a is decomposed and removed while preventing the top surface of ESC 24 except the outer periphery 24a from being exposed to a F radical.

8 Claims, 5 Drawing Sheets

CHAMBER CLEANING METHOD

CROSS-REFERENCE TO RELATED APPLICATION

This application claims the benefit of Japanese Patent Application No. 2009-203584 filed on Sep. 3, 2009, and U.S. Provisional Application Ser. No. 61/252,200 filed on Oct. 16, 2009, the entire disclosures of which are incorporated herein by reference.

FIELD OF THE INVENTION

The present disclosure relates to a chamber cleaning method for removing deposits adhered to an outer periphery of an electrostatic chuck positioned in a chamber of a substrate processing apparatus to mount a substrate thereon.

BACKGROUND OF THE INVENTION

As a substrate processing apparatus, there has been widely known a plasma processing apparatus which performs a predetermined process such as etching on a substrate by using plasma. The plasma processing apparatus includes a depressurizable processing chamber capable of generating plasma therein and accommodating a substrate such as a wafer for a semiconductor device; a mounting table (a susceptor) positioned in the chamber to mount the substrate thereon; an electrostatic chuck (ESC) positioned on an uppermost portion of the susceptor to hold the wafer; an upper electrode positioned above the ESC and facing the ESC at a certain distance to supply a processing gas into the chamber; and a focus ring (F/R) positioned in an upper outer periphery of the susceptor to surround the wafer.

The ESC is made of, for example, a circular plate-shaped ceramic member and includes therein an electrostatic electrode connected to a DC power supply. If a positive DC voltage is applied to the electrostatic electrode, a negative potential is generated on a rear surface (on the ESC side) of the wafer mounted on the top surface of the ESC, so that a potential difference is generated between the electrostatic electrode and the rear surface of the wafer W and thus the wafer is attracted to and held on the ESC by Coulomb force or Johnsen-Rahbek force caused by the potential difference.

Typically, the ESC has one size smaller diameter than the wafer mounted on the ESC, and, thus, there is a small gap between an outer periphery of the ESC and the rear surface of the wafer. Further, a CF polymer, which is a reaction product of a CF-based processing gas used in a plasma process, may be deposited as a deposit (hereinafter, simply referred to as "deposit") in this gap. A deposit deposited on, particularly, a shoulder of the outer periphery of the ESC (hereinafter, referred to as "shoulder deposit") may cause an error in attracting the wafer W onto the ESC, and, thus, the shoulder deposit may become a hindrance to a satisfactory plasma process. Particularly, in plasma etching using a substrate processing apparatus, a tendency to use a processing gas having a high deposition property becomes stronger, and, thus, a shoulder deposit becomes a serious problem.

Accordingly, there has been a need to remove a shoulder deposit as quickly as possible so that, conventionally, a shoulder deposit has been removed by a person. However, this method is inefficient in that whenever the shoulder deposit needs to be removed, a chamber needs to be open to the atmosphere. Therefore, recently, there has been employed a dry cleaning method capable of decomposing and removing the shoulder deposit by using oxygen ($O_2$) plasma without opening the chamber to the atmosphere. However, a region right above the outer periphery of the ESC is shielded by the wafer, and, thus, ions in the plasma cannot reach the outer periphery from the above. Therefore, the shoulder deposit may not be efficiently removed.

Meanwhile, a CF-based shoulder deposit generated from a CF-based processing gas could be removed by using the oxygen ($O_2$) plasma, but a shoulder deposit containing a metal such Al or Si from the wafer or members in the chamber in addition to the CF could not be removed by using the oxygen plasma. Accordingly, it has been known that the CF-based shoulder deposit containing Si or Al can be decomposed and removed by using plasma generated from a mixed gas of an $O_2$ gas and a fluorine (F) containing gas. As one example of a chamber cleaning method using plasma generated from a F containing gas, there has been disclosed a cleaning method in which an inductive plasma is generated within a chamber while introducing a fluorine containing gas into the chamber and an inside of the chamber is cleaned by the inductive plasma (see, for example, Patent Document 1).

Patent Document 1: Japanese Patent Laid-open Publication No. 2003-151971

However, when the inside of the chamber is cleaned by the plasma generated from the fluorine containing gas, a surface of the ESC made of, for example, $Al_2O_3$ is exposed to F radicals and thus eroded. Further, the upper electrode made of Si or SiC is exposed to the F radicals, and, thus, its surface becomes rough. Accordingly, so-called "black silicon" is formed on the upper electrode.

The present disclosure provides a chamber cleaning method capable of efficiently removing a CF-based deposit containing at least one of Si and metal and deposited on an outer periphery of an electrostatic chuck.

Further, the present disclosure provides a chamber cleaning method capable of removing a CF-based deposit containing at least one of Si and metal and deposited on an outer periphery of an electrostatic chuck without eroding a surface of the electrostatic chuck while preventing surface roughness of the upper electrode.

BRIEF SUMMARY OF THE INVENTION

In accordance with an aspect of the present disclosure, there is provided a chamber cleaning method for removing a CF-based deposit containing at least one of Si and metal adhered to an outer periphery of a table-shaped electrostatic chuck which is installed in a chamber of a substrate processing apparatus for performing a plasma process on a substrate and is configured to mount the substrate thereon. The chamber cleaning method includes irradiating plasma generated from a mixed gas of an oxygen gas and a fluorine-containing gas to the outer periphery of the electrostatic chuck so as to remove the deposit.

The mixed gas may be supplied toward the outer periphery of the electrostatic chuck and the plasma generated from the mixed gas may be irradiated only to the outer periphery of the electrostatic chuck.

A supply pressure of the mixed gas into the chamber may be set to be in a range from about $1.33 \times 10$ Pa (100 mTorr) to about $1.33 \times 10^2$ Pa (1000 mTorr).

An exposed surface of the electrostatic chuck except the outer periphery thereof may be coated with a mask material.

The mask material may be a mask gas of at least one of an oxygen gas, an argon gas, and a helium gas and the mask gas may be supplied toward a central portion of the electrostatic chuck except the outer periphery.

The substrate processing apparatus may include an upper electrode made of Si or SiC and positioned above the electrostatic chuck to face the electrostatic chuck with a space formed therebetween. A DC voltage in a range from about −80 V to about −100 V may be applied to the upper electrode. A mixing ratio of the oxygen gas to the mixed gas may be about 50% or more.

A cleaning time for removing the deposit may be set to be in a range from about 10 seconds to about 180 seconds and the DC voltage in a range from about −150 V to about −300 V may be applied to the upper electrode only for about 10 seconds to about 20 seconds in the beginning of cleaning.

The metal may be Al.

The deposit may be a multilayer deposit and composition of a processing gas for generating plasma may be changed for each layer of the multilayer deposit.

If the multilayer deposit includes at least a first CF-based deposit and a second CF-based deposit containing at least one of Si and Al, the first deposit may be removed by plasma generated from an oxygen gas and the second deposit may be removed by plasma generated from the mixed gas.

A cleaning process for removing the deposit may be performed after the substrate on which the plasma process has been performed is unloaded from the chamber before a next substrate to be processed is loaded into the chamber.

In accordance with the chamber cleaning method, the shoulder deposit is removed by irradiating plasma generated from the mixed gas of the oxygen ($O_2$) gas and the fluorine (F) containing gas to the outer periphery of the electrostatic chuck, and, thus, the deposit adhered to the outer periphery of the electrostatic chuck can be efficiently removed.

In accordance with the chamber cleaning method, the mixed gas is supplied toward the outer periphery of the electrostatic chuck and the plasma generated from the mixed gas is irradiated only to the outer periphery of the electrostatic chuck, and, thus, the deposit adhered to the outer periphery of the electrostatic chuck can be efficiently removed without eroding a central portion of the electrostatic chuck except the outer periphery.

In accordance with the chamber cleaning method, the supply pressure of the mixed gas into the chamber is set to be in the range from about 1.33×10 Pa (100 mTorr) to about 1.33× $10^2$ Pa (1000 mTorr), and, thus, the deposit adhered to the outer periphery can be efficiently removed by irradiating the plasma generated from the mixed gas only to the outer periphery of the electrostatic chuck without dispersing the mixed gas.

In accordance with the chamber cleaning method, the exposed surface of the electrostatic chuck except the outer periphery thereof is coated with the mask material, and, thus, the deposit adhered to the outer periphery can be removed without eroding a central portion on a top surface of the electrostatic chuck except the outer periphery.

In accordance with the chamber cleaning method, the mask material is a mask gas of at least one of an oxygen gas, an argon gas, and a helium gas and the mask gas is supplied toward a central portion of the electrostatic chuck except the outer periphery, and, thus, it is possible to prevent erosion of the top surface of the electrostatic chuck except the outer periphery.

In accordance with the chamber cleaning method, the DC voltage in a range from about −80 V to about −100 V is applied to the upper electrode and the mixing ratio of the oxygen gas to the mixed gas is about 50% or more, and, thus, a CF-based deposit containing at least one of Si and metal adhered to the outer periphery of the electrostatic chuck can be removed while preventing surface roughness of the upper electrode.

In accordance with the chamber cleaning method, the cleaning time for removing the deposit is set to be in a range from about 10 seconds to about 180 seconds and the DC voltage in a range from about −150 V to about −300 V is applied to the upper electrode only for about 10 seconds to about 20 seconds in the beginning of cleaning, and, thus, the deposit adhered to the outer periphery of the electrostatic chuck can be removed after the surface of the upper electrode which has been roughened at the beginning of cleaning is smoothed.

In accordance with the chamber cleaning method, the deposit is a multilayer deposit and composition of a processing gas for generating plasma is changed for each layer of the multilayer deposit, and, thus, the multilayer deposit can be efficiently removed under the optimum condition.

In accordance with the chamber cleaning method, if the multilayer deposit includes at least a first CF-based deposit and a second CF-based deposit containing at least one of Si and Al, the first deposit is removed by plasma generated from an oxygen gas and the second deposit is removed by plasma generated from the mixed gas, and, thus, the multilayer deposit can be efficiently removed under the optimum condition.

In accordance with the chamber cleaning method, a cleaning process for removing the deposit is performed after the substrate on which the plasma process has been performed is unloaded from the chamber before a next substrate to be processed is loaded into the chamber, and, thus, a satisfactory plasma process can be performed using the clean electrostatic chuck from which any deposit is removed.

BRIEF DESCRIPTION OF THE DRAWINGS

The disclosure may best be understood by reference to the following description taken in conjunction with the following figures.

DETAILED DESCRIPTION OF THE INVENTION

Hereinafter, there will be explained a chamber cleaning method in accordance with a first embodiment of the present disclosure.

Figure 1:
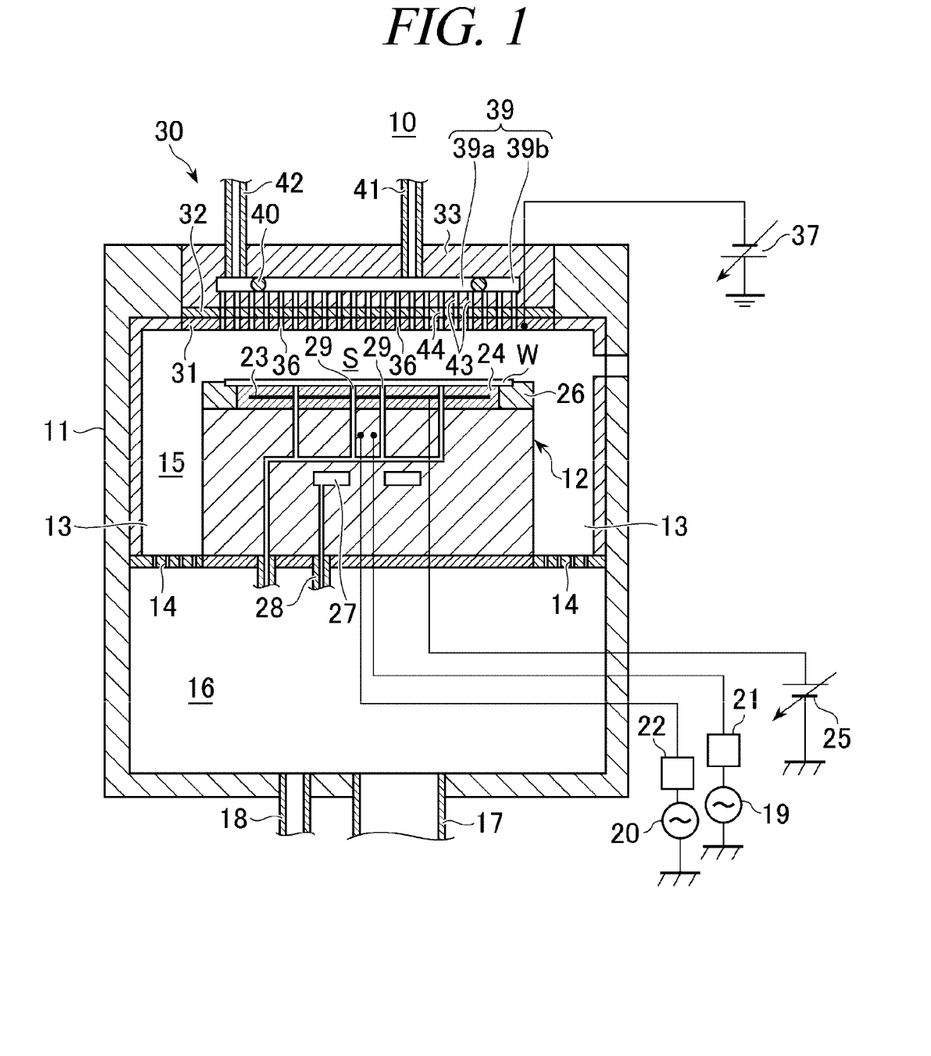
FIG. 1 is a cross-sectional view of a substrate processing apparatus performing a chamber cleaning method in accordance with the present disclosure.

FIG. 1 is a cross-sectional view of a substrate processing apparatus performing a chamber cleaning method in accordance with the present embodiment. This substrate processing apparatus is configured to perform a plasma process such as a RIE (Reactive Ion Etching) process or an asking process on a semiconductor wafer W as a substrate.

In FIG. 1, a substrate processing apparatus 10 includes a cylindrical processing chamber 11 and a columnar-shaped susceptor 12 positioned in the chamber 11 and serving as a mounting table for mounting thereon a semiconductor wafer (hereinafter, simply referred to as "wafer") W as a target substrate.

A gas exhaust path 13 serving as a flow path for discharging a gas in a chamber space S to the outside of the chamber 11 is formed between an inner wall surface of the chamber 11 and a side wall surface of the susceptor 12. A gas exhaust plate 14 is provided on the way of the gas exhaust path 13.

The gas exhaust plate 14 is a plate-shaped member having a multiple number of through holes and serves as a partition plate for partitioning the chamber 11 into an upper part and a lower part. In the upper part (hereinafter, referred to as "reaction chamber") 15 of the chamber 11 partitioned by the gas exhaust plate 14, plasma is generated as described later. Further, the lower part 16 (hereinafter, referred to as "exhaust chamber (manifold)") of the chamber is connected with gas exhaust lines 17 and 18 which discharge a gas in the chamber 11. The gas exhaust plate 14 confines or reflects the plasma generated in the reaction chamber 15, thereby preventing a leakage of the plasma into the manifold 16.

The gas exhaust line 17 is connected with a TMP (Turbo Molecular Pump) (not shown) and the gas exhaust pipe is connected with a DP (Dry Pump) (not shown). These pumps depressurize the inside of the chamber 11 by evacuation. To be specific, the DP depressurizes the inside of the chamber 11 from atmospheric pressure to a middle vacuum level (for example, about $1.33 \times 10$ Pa (100 mTorr) or less) and the TMP depressurizes the inside of the chamber 11 in cooperation with the DP to a high vacuum level (for example, about $1.33 \times 10^{-3}$ Pa ($1.0 \times 10^{-2}$ mTorr) or less) lower than the middle vacuum level. Further, a pressure in the chamber 11 is controlled by an APC valve (not shown).

The susceptor 12 in the chamber 11 is connected with a first high frequency power supply 19 and a second high frequency power supply 20 via a first matching unit 21 and a second matching unit 22, respectively. The first high frequency power supply 19 applies high frequency power (excitation power) having a relatively high frequency of, for example, about 60 MHz to the susceptor 12 and the second high frequency power supply 20 applies high frequency power (bias power) having a relatively low frequency of, for example, about 2 MHz to the susceptor 12. Accordingly, the susceptor 12 serves as a lower electrode for applying high frequency power to the processing space S between the susceptor 12 and a shower head 30 to be described later.

Provided on the susceptor 12 is an electrostatic chuck (ESC) 24 made of a circular plate-shaped insulating member in which an electrostatic electrode plate 23 is embedded. When the wafer W is mounted on the susceptor 12, the wafer W is positioned on the ESC 24. The electrostatic electrode plate 23 in the ESC 24 is electrically connected with a DC power supply 25. If a positive DC voltage is applied to the electrostatic electrode plate 23, a negative potential is generated on a surface (hereinafter, referred to as "rear surface") of the wafer W on the ESC 24 side, so that a potential difference is generated between the electrostatic electrode plate 23 and the rear surface of the wafer W. Accordingly, the wafer W is attracted to and held on the ESC 24 by Coulomb force or Johnsen-Rahbek force caused by the potential difference.

A circular ring-shaped focus ring 26 is mounted on the susceptor 12 to surround the wafer W attracted to and held on the ESC 24. The focus ring 26 is made of a conductive material such as silicon and improves efficiency of a RIE process by converging the plasma toward the surface of the wafer W.

Further, a ring-shaped coolant path 27 extending, e.g., in a circumferential direction of the susceptor 12 is provided within the susceptor 12. A low temperature coolant such as cooling water or Galden (registered trademark) fluid is circulated through and supplied into the coolant path 27 from a chiller unit (not shown) via a coolant pipe 28. The susceptor 12 cooled by the low temperature coolant cools the wafer W and the focus ring 26 via the ESC 24.

A multiple number of heat transfer gas supply holes are opened to a portion (hereinafter, referred to as "attracting surface") of a top surface of the ESC 24 to/on which the wafer is attracted and held. These heat transfer gas supply holes 29 supply a helium (He) gas as a heat transfer gas to a gap between the attracting surface and the rear surface of the wafer W. The helium gas supplied to the gap between the attracting surface and the rear surface of the wafer W efficiently transfers heat of the wafer W to the ESC 24.

The shower head 30 is installed at a ceiling facing the ESC 24 via the processing space S. The shower head 30 includes an upper electrode 31 exposed to the processing space S to face the wafer W mounted on the ESC 24; an insulating plate 32 made of an insulating material; and an electrode support 33 for supporting the upper electrode 31 via the insulating plate 32. The upper electrode 31, the insulating plate 32, and the electrode support 33 are stacked on the top of each other in this sequence.

The upper electrode 31 is made of a conductive material or a semiconductor material such as single crystalline silicon (Si). The upper electrode 31 is configured as a circular plate-shaped member having a diameter of, for example, about 300 mm and has a plurality of gas flow paths 36 formed therethrough in a thickness direction. The upper electrode 31 is connected to a DC power supply 37.

The electrode support 33 includes a buffer room 39 therein. The buffer room 39 is a cylindrical space having a central axis substantially same as a central axis of the wafer W and is partitioned into an inner buffer room 39a and an outer buffer room 39b by a circular ring-shaped sealing member such as an O-ring 40.

The inner buffer room 39a is connected to a processing gas inlet line 41 and the outer buffer room 39b is connected to a processing gas inlet line 42. The processing gas inlet lines 41 and 42 introduce processing gases into the inner buffer room 39a and the outer buffer room 39b, respectively.

Each of the processing gas inlet lines 41 and 42 has a mass flow controller (MFC) (not shown), and, thus, flow rates of the processing gases introduced into the inner buffer room 39a and the outer buffer room 39b are individually controlled. The buffer room 39 communicates with the processing space S via a gas flow path 43 of the electrode support 33, a gas flow path 44 of the insulating plate 32, and the gas flow path 36 of the upper electrode 31. The processing gas introduced into the inner buffer room 39a or the outer buffer room 39b is supplied into the processing space S. At this time, by adjusting flow rates or pressures of the processing gases introduced into the inner buffer room 39a and the outer buffer room 39b, a distribution of the processing gases in the processing space S can be controlled.

Figure 2:
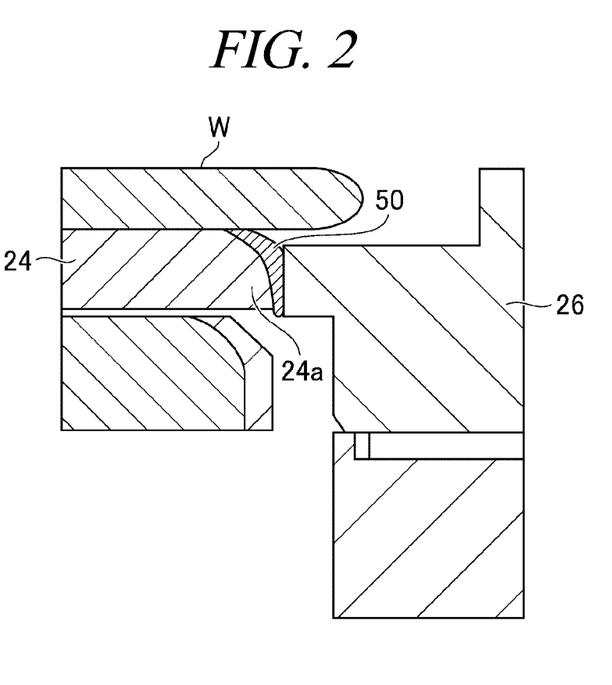
FIG. 2 is an enlarged view showing a vicinity of an outer periphery of an electrostatic chuck of FIG. 1.

FIG. 2 is an enlarged view showing a vicinity of an outer periphery of the ESC of FIG. 1.

In FIG. 2, there is a gap between a sidewall of the focus ring 26 and an outer periphery 24a of the ESC 24 surrounded by the focus ring 26 and supporting the wafer W. A deposit is adhered to the outer periphery 24a of the ESC in this gap. A deposit (hereinafter, referred to as "shoulder deposit") 50 adhered to, particularly, a shoulder of the outer periphery 24a of the ESC 24 may cause an error in attracting the wafer W onto the ESC 24 and may become a hindrance to a satisfactory plasma process.

The present inventors have conducted researches on a method of efficiently removing the CF-based shoulder deposit 50 containing at least one of Si and metal. As a result of the researches, the present inventors found that the shoulder deposit 50 on the outer periphery 24a of the ESC 24 can be efficiently removed without eroding a central surface of the ESC 24 by irradiating plasma generated from a mixed gas of an $O_2$ gas and a F containing gas onto the outer periphery 24a of the ESC 24.

Figure 3A:
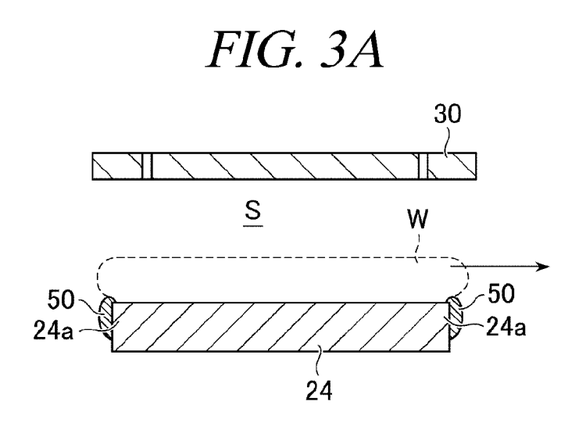
FIGS. 3A to 3C show process diagrams of a chamber cleaning method in accordance with an embodiment of the present disclosure.
Figure 3B:
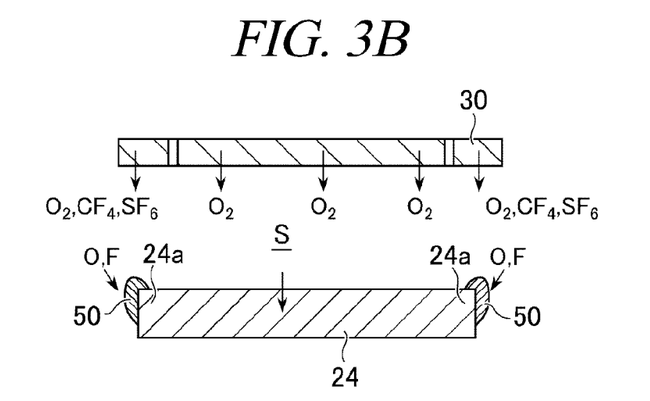
Figure 3C:
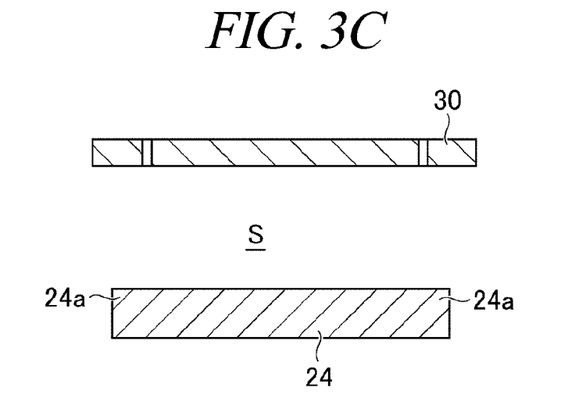

FIGS. 3A to 3C show process diagrams of a chamber cleaning method in accordance with the present embodiment. This chamber cleaning method is a kind of dry cleaning methods. Further, FIGS. 3A to 3C schematically showing a main part of FIG. 1 illustrate the ESC 25 for mounting the wafer W thereon and the shower head 30 including the upper electrode 31 positioned above the ESC 24 so as to face the ESC 24 with the processing space S therebetween.

In FIGS. 3A to 3C, in order to remove the shoulder deposit 50 deposited on the outer periphery 24a of the ESC 24, a wafer W on which a predetermined plasma process such as an etching process or an asking process has been performed is unloaded from the chamber 11, so that the shoulder deposit 50 is exposed (see FIG. 3A).

Subsequently, a pressure in the chamber 11 is set to be, for example, about $1.06 \times 10^2$ Pa (800 mTorr) by the APC valve or the like. Further, a temperature in the chamber 11 is set be, for example, in the range from about 40° C. to about 90° C. Furthermore, the $O_2$ gas having a flow rate of, for example, about 1200 sccm and the F containing gases such as a $CF_4$ gas and a $SF_6$ gas each having a flow rate of, for example, about 300 sccm are supplied into the chamber 11 from the outer buffer room 39b of the shower head 30 via its corresponding gas flow path. A mixing ratio of the $O_2$ gas to a mixed gas (hereinafter, referred to as "F containing mixed gas") of the $O_2$ gas, the $CF_4$ gas, and the $SF_6$ gas is about 50% or more. Meanwhile, an $O_2$ single gas having a flow rate of, for example, about 1500 sccm is supplied into the chamber 11 from the inner buffer room 39a via its corresponding gas flow path.

Moreover, excitation power of about 750 W and bias power of about 0 W are applied to the ESC 24. At this time, the F containing mixed gas of the $O_2$ gas, the $CF_4$ gas, and the $SF_6$ gas supplied from the outer buffer room 39b is excited into plasma by the excitation power applied to the processing space S, and, thus, ions or radicals are generated (see FIG. 3B). Among these ions or radicals, F radicals mainly collide with the CF-based shoulder deposit 50 containing Si and Al deposited on the outer periphery 24a of the ESC 24 to chemically decompose and remove the shoulder deposit 50 (see FIG. 3C).

At this time, Si and Al contained in the shoulder deposit 50 are dispersed in the form of $SiF_x$ and $AlF_x$, respectively and finally discharged to the outside of the chamber 11. Therefore, since the shoulder deposit 50 is decomposed and removed, Si or Al does not remain in the chamber 11. Further, since radicals of $O_2$ plasma generated from the $O_2$ gas are irradiated to the top surface of the ESC 24 except the outer periphery 24a (see FIG. 3B), irradiation of the F radicals to the top surface of the ESC 24 except the outer periphery 24a is prevented. Accordingly, the top surface of the ESC 24 except the outer periphery 24a is not eroded by the F radicals. Furthermore, since the ESC 24 is made of, for example, $Al_2O_3$, even if oxygen radicals are irradiated thereto, the ESC 24 is stable and not eroded. Here, the plasma generated from the $O_2$ gas serves as a mask for protecting the central surface of the ESC 24 except the outer periphery 24a.

In this way, after the shoulder deposit 50 of the ESC 24 is decomposed and removed, a next wafer W to be processed is loaded into the chamber 11 and mounted on the ESC 24.

In accordance with the present embodiment, since the plasma generated from the F containing mixed gas of the $O_2$ gas, the $CF_4$ gas, and the $SF_6$ gas is irradiated to the outer periphery 24a of the ESC 24, the shoulder deposit 50 can be decomposed and removed by the F radicals in the plasma although the shoulder deposit 50 contains Si and Al. Further, since the top surface of the ESC 24 except the outer periphery 24a is covered with the oxygen plasma, the top surface can be prevented from being eroded by the F radicals.

In accordance with the present embodiment, an introduction pressure of the F containing mixed gas is set to be in the range from about $1.33 \times 10$ Pa (100 mTorr) to about $1.33 \times 10^2$ Pa (1000 mTorr), desirably, in the range from about $5.32 \times 10$ Pa (400 mTorr) to about $1.06 \times 10^2$ Pa (800 mTorr). If the introduction pressure is lower than about $1.33 \times 10$ Pa (100 mTorr), the F containing mixed gas is likely to be dispersed and an introduction direction is not determined. Accordingly, the F radicals cannot be successfully irradiated to the outer periphery 24a of the ESC 24, and, thus, the shoulder deposit 50 cannot be removed efficiently. Meanwhile, even if the introduction pressure is set to be higher than about $1.33 \times 10^2$ Pa (1000 mTorr), a better effect cannot be obtained and control also becomes complicated. If the introduction pressure of the F containing mixed gas is set to be in the range from about $1.33 \times 10$ Pa (100 mTorr) to about $1.33 \times 10^2$ Pa (1000 mTorr), particularly, in the range from about $5.32 \times 10$ Pa (400 mTorr) to about $1.06 \times 10^2$ Pa (800 mTorr), the shoulder deposit 50 can be decomposed and removed efficiently by irradiating the F radicals generated from the F containing mixed gas only to the outer periphery 24a of the ESC 24.

In the present embodiment, as the F containing gas contained in the F containing mixed gas, a $C_xF_y$ gas, a $SF_6$ gas, a $NF_3$ gas or a $F_2$ gas may be employed. Further, as the mask gas for covering the surface of the ESC 24 except the outer periphery 24a, an argon (Ar) gas or a helium (He) gas may be used in addition to the oxygen gas.

In the present embodiment, if the shower head 30 is made of Si or SiC, it is desirable that a bias voltage for attracting ions in the plasma is applied to the shower head and a mixing ratio of the $O_2$ gas to the F containing mixed gas is set to be about 50% or more to prevent the surface of the shower head 30 made of Si or SiC from being exposed to the F radicals and having irregularities, i.e., to prevent formation of so-called "black silicon."

Regarding the formation of black silicon on a Si member and a SiC member, the Si member will be explained.

If a member made of Si such as a shower head is exposed to oxygen radicals and F radicals in plasma, Si on a surface of the shower head is oxidized into $SiO_2$ by the oxygen radicals. At this time, in a microscopic view, Si on the surface of the shower head is not uniformly oxidized but irregularly oxidized into $SiO_2$ and there remains Si which has not been oxidized. Further, F radicals with energy lower than a predetermined level do not react with $SiO_2$ but F radicals without energy may actively react with the remaining non-oxidized Si. Therefore, the F radicals may react with the irregularly remaining Si and extract Si in the form of $SiF_x$, thereby forming recesses in the portion where Si exists. Further, the F radicals are further introduced into the recesses irregularly formed on the surface of the shower head as described above; react with Si on surfaces of the recesses, and extract Si in the form of $SiF_x$, thereby forming larger recesses. In this way, protrusions and recesses in the surface of the shower head become larger, so that the shower head may have an uneven surface, i.e., black silicon.

In the present embodiment, in order to prevent formation of black silicon, during cleaning of the shoulder deposit 50 while exposing the shower head 30 made of Si or SiC to oxygen radicals and F radicals, ions in the plasma are attracted by applying a bias voltage to the shower head 30; and a $SiO_2$ portion where Si has been oxidized and a Si portion where Si has not been oxidized are uniformly sputtered by the ions, thereby smoothing a surface of the shower head 30. Therefore, formation of black silicon is prevented.

At this time, by increasing an absolute value of the bias voltage to be applied to the shower head 30 to, for example, about −300 V, selectivity of the F radicals to $SiO_2$ and Si becomes equal so that both of the $SiO_2$ portion and the Si portion can be uniformly eroded. Accordingly it is possible to prevent formation of black silicon regardless of concentration of $O_2$ in the F containing mixed gas. However, as the bias voltage is increased in this way, the erosion amount of the surface of the shower head 30 becomes increased, and, thus, abrasion of the shower head 30 is accelerated.

Accordingly, in the present embodiment, in order to minimize the erosion amount of the shower head 30 and prevent formation of black silicon on the shower head 30 made of Si, a DC voltage to be applied to the shower head 30 is set to be in the range from about −80 V~−100 V and a mixing ratio of the $O_2$ gas to the F containing mixed gas is set to be about 50% or more. By satisfying these conditions, the erosion amount of the surface of the shower head 30 can be maintained as small as necessary and formation of black silicon can also be prevented, and, the shoulder deposit 50 can be decomposed and removed well.

If the absolute value of the bias voltage is lower than about 80 V, the amount of attracted ions is not enough to sufficiently prevent the formation of black silicon, whereas if the absolute value of the bias voltage is higher than about 100 V, the amount of attracted ions is too great, and, thus, the surface of the shower head 30 becomes eroded more than necessary.

In the present embodiment, if the surface of the shower head 30 is roughened from the beginning of cleaning for removing the shoulder deposit 50, the bias voltage to be applied to the shower head 30 is maintained high for a predetermined time period at the beginning of cleaning, so that the surface of the shower head 30 can be actively eroded and smoothed.

At this time, the bias voltage to be applied to the shower head 30 at the beginning of cleaning is set to be in the range from about −150 V to about −300 V. Further, the total cleaning time for decomposing and removing the shoulder deposit 50 is set to be, for example, in the range from about 10 seconds to about 180 seconds, and the time for applying a high bias voltage at the beginning of cleaning is set to be, for example, in the range from about 10 seconds to about 20 seconds. Accordingly, in the beginning of cleaning, relatively great amounts of ions are attracted to the surface of the shower head 30 and thus the rough surface thereof can be actively sputtered and smoothed by these ions. Thereafter, the typical bias voltage in the range from about −80 V to about −100 V is applied to prevent formation of black silicon and the shoulder deposit 50 deposited on the outer periphery 24a of the ESC 24 is decomposed and removed.

If the absolute value of the bias voltage is lower than about 150 V in the beginning of cleaning, the amount of attracted ions is not enough to sufficiently smooth the surface of the shower head 30. Meanwhile, if the absolute value of the bias voltage is higher than about 300 V, the amount of attracted ions is too great, and, thus, the surface of the shower head 30 is too much eroded and abrasion thereof is accelerated. Further, if the time for maintaining the bias voltage high is shorter than about 10 seconds in the beginning of cleaning, the surface of the shower head 30 is not sufficiently smoothed, but if the time exceeds about 20 seconds, the surface of the shower head 30 becomes eroded more than necessary.

By maintaining the absolute value of the bias voltage to be in an appropriate range for a predetermined time period in the beginning of cleaning, the surface of the shower head 30 can be smoothed and roughness of the surface can be suppressed. Accordingly, a cycle of cleaning or maintenance for the chamber can be extended, and, thus, a process efficiency or productivity of the substrate processing apparatus can be improved.

In the present embodiment, the DC voltage is used as the bias voltage, but it may also be possible to apply an AC voltage having the same effect as that of the DC voltage.

In the present embodiment, the shoulder deposit 50 is a CF-based deposit containing at least one of Si and metal. C and F are elements of a deposition gas such as $CHF_3$, and Si and metal such as Al are released from the member within the chamber or the wafer W. That is, Si is released from a hard mask when an organic film is etched using the hard mask made of, for example, $SiO_2$ as a mask material. Further, in case of using, for example, a $TiO_2$ film as a hard mask, Ti is released therefrom and mixed into the shoulder deposit 50. Al is an element of the member within the chamber such as the ESC 25 and released from this member.

In the present embodiment, there has been explained the shower head as the member made of Si or SiC within the chamber, but if the focus ring or other members within the chamber are made of Si or SiC, it may be also possible to treat the focus ring or the other members in the same manner.

In the present embodiment, a cleaning process of removing the shoulder deposit 50 is performed on each single wafer, i.e., whenever a plasma process is performed to each wafer W.

Hereinafter, there will be explained a chamber cleaning method in accordance with a second embodiment of the present disclosure.

In the present embodiment, if a shoulder deposit is a multilayer shoulder deposit, a cleaning condition, particularly, composition of a processing gas for generating plasma, is changed for each layer of the multilayer shoulder deposit.

Figure 4:
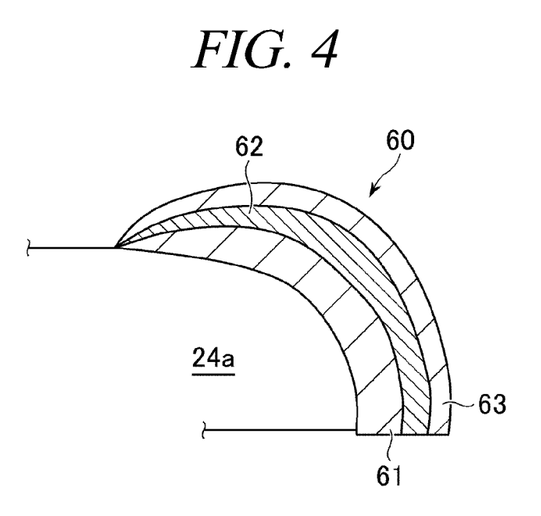
FIG. 4 is a cross-sectional view of a multilayer shoulder deposit.

FIG. 4 is a cross-sectional view of a multilayer shoulder deposit. In FIG. 4, a multilayer shoulder deposit is adhered and deposited on the outer periphery 24a of the ESC 24. The multilayer shoulder deposit 60 includes a lower deposit 61 made of CF; a CF-based intermediate deposit 62 containing Si and Al deposited on a surface of the lower deposit 61; and an upper deposit 63 made of CF deposited on a surface of the intermediate deposit 62. Main elements of the lower deposit 61 and the upper deposit 63 are carbon (C), fluorine (F), and oxygen (O). Further, main elements of the intermediate deposit are carbon (C), fluorine (F), oxygen (O), silicon (Si), and aluminum (Al).

Such a multilayer shoulder deposit may be removed in the following way.

FIGS. 5A to 5G show process diagrams of a chamber cleaning method for removing the multilayer shoulder deposit 60.

Figure 5A:
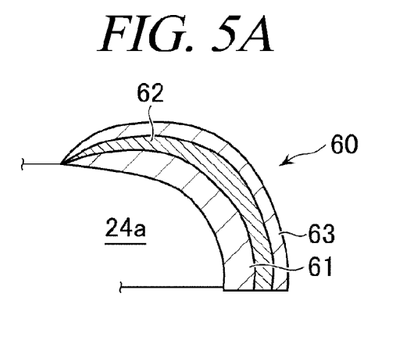
FIGS. 5A to 5G show process diagrams of a chamber cleaning method for removing the multilayer shoulder deposit.
Figure 5B:
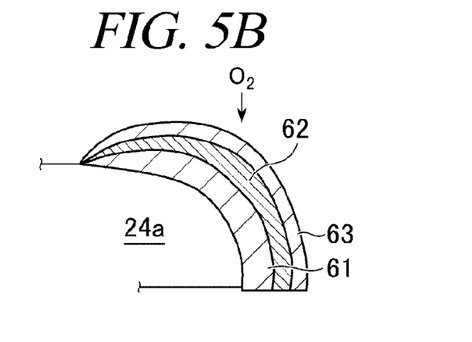
Figure 5C:
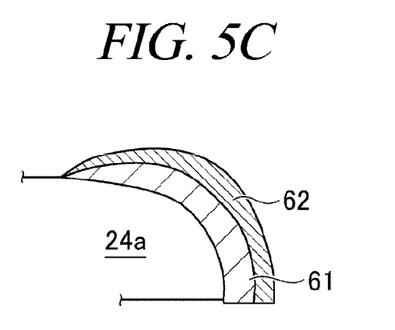
Figure 5D:
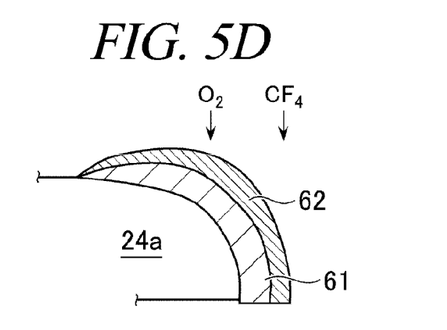
Figure 5E:
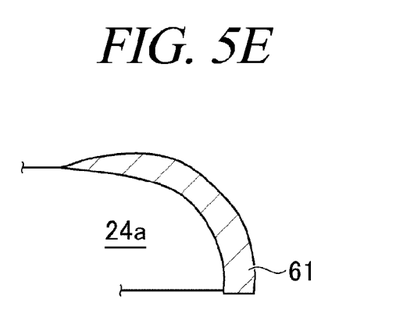
Figure 5F:
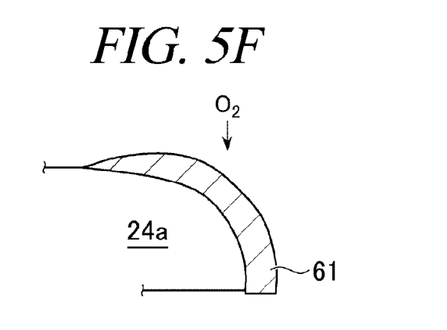

In FIGS. 5A to 5G, in order to clean the multilayer shoulder deposit 60, the processed wafer W mounted on the ESC 24 of the substrate processing apparatus 10 in FIG. 1 is first unloaded and the multilayer shoulder deposit 60 is then exposed (see FIG. 5A). Then, a pressure in the chamber is set to be, for example, about $1.06 \times 10^2$ Pa (800 mTorr) by the APC vale or the like. Further, a temperature in the chamber 11 is set to be, for example, in the range from about 40° C. to about 90° C.

Furthermore, an $O_2$ single gas having a flow rate of, for example, about 1500 sccm is supplied into the chamber 11 from the outer buffer room 39b of the shower head 30 via its corresponding gas flow path. Moreover, excitation power of, for example, about 750 W and bias power of, for example, about 0 W are applied to the ESC 24. At this time, the $O_2$ gas supplied into the chamber is excited into plasma by the excitation power applied to the processing space S and ions or radicals are generated (see FIG. 5B). These ions or radicals collide with the upper deposit 63 of the multilayer shoulder deposit 60 deposited on the outer periphery 24a of the ESC 24 and decompose and remove the upper deposit 63 (see FIG. 5C).

Since the ESC 24 is made of, for example, $Al_2O_3$, it is not etched by oxygen plasma. Therefore, the oxygen gas may be supplied from the inner buffer room 39a as well as the outer buffer room 39b and it is not necessary to use a mask material for covering the surface of the ESC 24.

After the upper deposit 63 is decomposed and removed, the supply of the $O_2$ gas is stopped and the inside of the chamber 11 is returned back to an initial state in the beginning of cleaning. Then, a mixed gas of an $O_2$ gas and a $CF_4$ gas is supplied into the chamber 11 from the outer buffer room 39b of the shower head 30 via its corresponding gas flow path. The $O_2$ gas has a flow rate of, for example, about 1500 sccm and the $CF_4$ gas has a flow rate of, for example, about 1500 sccm. A mixing ratio of the $O_2$ gas to the F containing mixed gas of the $O_2$ gas and the $CF_4$ gas is about 50%. Further, at this time, an $O_2$ single gas having a flow rate of, for example, about 1500 sccm is supplied into the chamber 11 from the inner buffer room 39a via its corresponding gas flow path.

Moreover, excitation power of about 750 W and bias power of about 0 W are applied to the ESC 24. At this time, the F containing mixed gas of the $O_2$ gas and the $CF_4$ gas supplied from the outer buffer room 39b is excited into plasma by a high frequency power applied to the processing space S and ions or radicals are generated (see FIG. 5D). Among these ions or radicals, F radicals mainly collide with the intermediate deposit 62 of the multilayer shoulder deposit 60 and decompose and remove the intermediate deposit (see FIG. 5E).

At this time, radicals of the $O_2$ plasma is irradiated onto a top surface of the ESC except the outer periphery 24a, and, thus, it is possible to prevent irradiation of the F radicals onto the top surface of the ESC except the outer periphery 24a. Accordingly, the top surface of the ESC except the outer periphery 24a is not exposed to and eroded by the F radicals.

After the intermediate deposit 62 is decomposed and removed, the supply of the F containing mixed gas and the $O_2$ single gas is stopped and the inside of the chamber 11 is returned back to the initial state. Then, an $O_2$ single gas having a flow rate of, for example, about 1500 sccm is supplied into the chamber 11 from the outer buffer room 39b of the shower head 30 via its corresponding gas flow path. Further, excitation power of about 750 W and bias power of about 0 W are applied to the ESC 24. At this time, the $O_2$ gas supplied into the chamber is excited into plasma by high frequency power applied to the processing space S and ions or radicals are generated (see FIG. 5F).

Figure 5G:
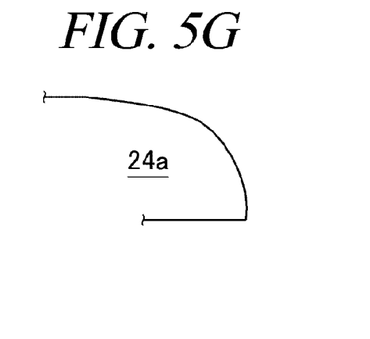

These ions or radicals collide with the lower deposit 61 deposited on the shoulder of the outer periphery 24a of the ESC 24 and decompose and remove the lower deposit 61 (see FIG. 5G). After the multilayer shoulder deposit 60 deposited on the outer periphery of the ESC 24 is decomposed and removed in the above-described manner, a non-processed wafer W on which a predetermined plasma process will be performed is loaded into the chamber 11.

In accordance with the present embodiment, it is possible to efficiently decompose and remove the multilayer shoulder deposit 60 including the CF-based lower deposit 61 and upper deposit 63 not containing Si or metal; and the CF-based intermediate deposit 62 containing Si and Al as metal by using plasma appropriate for each layer.

Timing of changing the processing gas from the $O_2$ single gas to the F containing mixed gas and timing of changing from the F containing mixed gas to the $O_2$ single gas in the present embodiment can be obtained in advance from an experiment using the same multilayer shoulder deposit 60. Further, a detection unit for detecting a specific element may be equipped in the chamber and the processing gas can be changed upon detecting or not detecting a specific element during cleaning.

In the present embodiment, it is possible to employ a method of preventing formation of black silicon on the shower head 30 and a method of smoothing the surface of the shower head 30 at the beginning of cleaning if the surface is roughened at the beginning of cleaning in the same manner as the first embodiment.

In each embodiment described above, a substrate on which a plasma process is performed is not limited to a wafer for a semiconductor device and may be various kinds of substrates used for a FPD (Flat Panel Display) as well as a LCD (Liquid Crystal Display), or a photomask, a CD substrate, or a print substrate.

The present disclosure can be implemented by providing a storage medium which stores a program code of software implementing the function of each embodiment to a system or an apparatus and by reading and executing the program code stored in the storage medium by a computer (or a CPU or a MPU) of the system or the apparatus.

In this case, the program code read from the storage medium implements the function of each embodiment, and, thus, the program code and the storage medium storing the program code constitute the present disclosure.

Further, by way of example, as a storage medium for storing the program code, a floppy (registered trademark) disc, a hard disc, a magneto-optical disc, an optical disc such as a CD-ROM, a CR-R, a CD-RW, a DVD-ROM, a DVD-RAM, a DVD-RW or a DVD+RW, a magnetic tape, a nonvolatile memory card, and a ROM can be used. Otherwise, the program code may be downloaded via a network.

The function of each embodiment can be implemented by executing the program code read by the computer, and an OS (operating system) operated on the computer may perform a part or all of the actual process in response to instructions of the program code and the function of each embodiment may be implemented by the process.

Further, the program code read from the storage medium may be written in a memory of a function extension board inserted into the computer or a function extension unit connected to the computer, and a CPU of the function extension board or the function extension unit may perform a part or all of the actual process in response to instructions of the program code and the function of each embodiment may be implemented by the process.

What is claimed is:

1. A chamber cleaning method for removing a CF-based deposit containing at least one of Si and metal adhered to an outer periphery of a table-shaped electrostatic chuck which is installed in a chamber of a substrate processing apparatus configured to perform a plasma process on a substrate and is configured to mount the substrate thereon, the method comprising:

supplying a mixed gas of an oxygen gas and a fluorine-containing gas toward the outer periphery of the electrostatic chuck, supplying a mask gas toward a central portion of the electrostatic chuck, irradiating a first plasma generated from the mixed gas only to the outer periphery of the electrostatic chuck so as to remove the deposit, and irradiating a second plasma generated from the mask gas only to the central portion of the electrostatic chuck, wherein the mask gas is supplied simultaneously with the mixed gas, and the second plasma is irradiated simultaneously with the first plasma, so that the first plasma is suppressed from being irradiated to the central portion of the electrostatic chuck, and the mask gas includes at least an oxygen gas and wherein the substrate processing apparatus includes an upper electrode made of Si or SiC and positioned above the electrostatic chuck to face the electrostatic chuck with a space formed therebetween, and wherein a cleaning time for removing the deposit is set to be in a range from 10 seconds to 180 seconds, a DC voltage in a range from −150 V to −300 V is applied to the upper electrode only for 10 seconds to 20 seconds in the beginning of cleaning, and during a remaining cleaning time after applying the DC voltage in the range from −150 V to −300 V, a DC voltage in a range from −80 V to −100 V is applied to the upper electrode.

2. The chamber cleaning method of claim 1, wherein the metal is Al.

3. The chamber cleaning method of claim 1, wherein the deposit is a multilayer deposit and composition of the mixed gas for generating the first plasma is changed for each layer of the multilayer deposit.

4. The chamber cleaning method of claim 3, wherein if the multilayer deposit includes at least a first CF-based deposit and a second CF-based deposit containing at least one of Si and Al, the first deposit is removed by plasma generated from an oxygen gas and the second deposit is removed by the first plasma generated from the mixed gas.

5. The chamber cleaning method of claim 1, wherein a cleaning process for removing the deposit is performed after the substrate on which the plasma process has been performed is unloaded from the chamber before a next substrate to be processed is loaded into the chamber.

6. The chamber cleaning method of claim 1, wherein a supply pressure of the mixed gas into the chamber is set to be in a range from $1.33 \times 10$ Pa (100 mTorr) to $1.33 \times 10^2$ Pa (1000 mTorr).

7. The chamber cleaning method of claim 1, wherein the mask gas further includes at least one of an argon gas and a helium gas.

8. The chamber cleaning method of claim 1, wherein a mixing ratio of the oxygen gas to the mixed gas is 50% or more.

* * * * *

UNITED STATES PATENT AND TRADEMARK OFFICE
CERTIFICATE OF CORRECTION

| | |
|---|---|
| PATENT NO. | : 8,999,068 B2 |
| APPLICATION NO. | : 12/873458 |
| DATED | : April 7, 2015 |
| INVENTOR(S) | : Masanobu Honda |

It is certified that error appears in the above-identified patent and that said Letters Patent is hereby corrected as shown below:

In the Specification

Column 5, line 16, please add -- 11 -- between "chamber" and "is connected"

Column 6, line 7, please add -- 29 -- between "holes" and "are"

Column 8, line 44, please add -- 30 -- between "head" and "and"

Column 10, line 46, please add -- 60 -- between "deposit" and "is"

Column 10, line 66, please add -- 11 -- between "chamber" and "is"

Column 11, line 43, please add -- 62 -- between "deposit" and "(see FIG."

Signed and Sealed this
Twenty-ninth Day of September, 2015

Michelle K. Lee
*Director of the United States Patent and Trademark Office*